(12) United States Patent
Rijssemus

(10) Patent No.: US 8,471,648 B2
(45) Date of Patent: Jun. 25, 2013

(54) SIGNAL DIVIDING DEVICE

(75) Inventor: Martien Rijssemus, Veenendaal (NL)

(73) Assignee: Technetix Group Limited, West Sussex (GB)

( * ) Notice: Subject to any disclaimer, the term of this patent is extended or adjusted under 35 U.S.C. 154(b) by 523 days.

(21) Appl. No.: 12/658,156

(22) Filed: Feb. 2, 2010

(65) Prior Publication Data

US 2010/0194492 A1  Aug. 5, 2010

Related U.S. Application Data

(60) Provisional application No. 61/206,670, filed on Feb. 2, 2009.

(51) Int. Cl.
*H03H 7/38* (2006.01)
*H04B 1/58* (2006.01)

(52) U.S. Cl.
USPC .......................................... 333/131; 333/119

(58) Field of Classification Search
USPC .................................................. 333/119, 131
See application file for complete search history.

(56) References Cited

U.S. PATENT DOCUMENTS

| | | |
|---|---|---|
| 3,673,517 A | 6/1972 | Ticknor |
| 5,006,822 A | 4/1991 | Reddy |
| 5,021,756 A * | 6/1991 | Tajima et al. ................. 333/132 |
| 6,622,304 B1 | 9/2003 | Carhart |
| 7,755,452 B2 * | 7/2010 | Knickerbocker et al. ..... 333/131 |
| 2002/0166124 A1 | 11/2002 | Gurantz et al. |
| 2002/0186096 A1 | 12/2002 | Zheng et al. |
| 2005/0289632 A1 | 12/2005 | Brooks et al. |
| 2007/0039035 A1 | 2/2007 | Magin |

FOREIGN PATENT DOCUMENTS

WO  WO 2004/023729 A1  3/2004

OTHER PUBLICATIONS

International Search Report, Jun. 9, 2010.

* cited by examiner

*Primary Examiner* — Robert Pascal
*Assistant Examiner* — Kimberly Glenn
(74) *Attorney, Agent, or Firm* — Abelman, Frayne & Schwab

(57) ABSTRACT

There is provided a signal dividing device (10) for use in a co-axial network used for distributing signals within the home, the signal dividing device (10) comprising an impedance transformer (12), a first (14) and a second (16) two-way signal splitter, each two-way signal splitter having an input, and first and second outputs. The output (22) of the impedance transformer is connected to the input of the first and the second signal splitter, the other port (20) of the impedance transformer being connected to earth. Resistive elements (32, 34) are connected between the outputs of the first and second signal splitters respectively. A diplex filter (40) may be connected at the input (18) of the impedance transformer (12).

5 Claims, 1 Drawing Sheet

SIGNAL DIVIDING DEVICE

CROSS REFERENCE TO RELATED APPLICATION

This patent application claims the benefit of U.S. Provisional Application Ser. No. 61/206,670, filed Feb. 2, 2009, the content of which is incorporated by reference herein in its entirety.

FIELD OF THE INVENTION

This invention relates to a signal dividing device in particular for use in an in-home coaxial network.

BACKGROUND TO THE INVENTION

Most homes have an in-home network installed to distribute TV signals from an external provider. Signal dividing devices are used within such networks to distribute TV signals to more than one location in the home allowing the consumer to have multiple devices connected to the network. Often there is also a need to distribute data and other signals to and from locations throughout the home and there are several technologies available to achieve this, such as PowerLine, MoCA, wireless, fibre optic and CAT-5. However these technologies all have disadvantages.

It is an object of the present invention to provide a signal dividing device which will allow a coaxial network to be used for two-way communication of data and other signals.

SUMMARY OF THE INVENTION

In accordance with the present invention, a signal dividing device for use in a co-axial network used for distributing signals within the home, the signal dividing device comprising an impedance transformer, a first and second two-way signal splitter, each two-way signal splitter having an input, and first and second outputs, wherein the output of the impedance transformer is connected to the input of the first and the second signal splitter. Such a signal dividing device has a low isolation between the outputs of the first and second signal splitter and is suitable for two-way communication of data or other signals, including the TV signals usually distributed, to and from locations within the home. The device also has a low loss from the input of the impedance transformer to the outputs of the first and second two-way splitter.

Preferably the impedance transformer is an auto-transformer. Preferably a first resistive element is connected between the outputs of the first signal splitter and a second resistive element is connected between the outputs of the second signal splitter, with typically the first and second resistive elements having a resistance value of approximately 150 Ohm.

Desirably the impedance ratio of the impedance transformer is selected to ensure the characteristic impedance at the output of the impedance transformer is the same as a one fourth of the characteristic impedance of the outputs of the first and second signal splitters, thereby to give a very good input return loss. Where the first and second resistive elements have a value of approximately 150 Ohm, the signal dividing device will have an impedance of approximately 75 Ohm on all ports.

The device may further comprise a diplex filter, or diplexer, connected at the input of the impedance transformer. Use of a diplexer is of particular advantage where an input signal is entering the signal dividing device via an RF modem, HPNA, PowerLine or other such devices which have no or limited return loss outside their specific frequency range and so have a characteristic impedance not equal to the impedance of the signal dividing device over the required frequency range, typically 4 MHz to 2000 MHz. In such instances, the diplex filter will be terminated at the high frequency port with a resistor with a value equal to the characteristic impedance of approximately 75 Ohm.

Typically the signal dividing device will be used within an in-home co-axial network, with typically a signal linking device, such as a modem, in communication with the input of the impedance transformer acting as the communication path between the in-home network and a CATV/satellite/data service provider. A signal dividing device as described above will provide one input and four outputs with the outputs connectible to different items of subscriber equipment within the home.

BRIEF DESCRIPTION OF THE DRAWINGS

The invention will now be described, by way of example, and with reference to the accompanying drawings in which.

To facilitate understanding of the invention, identical reference numerals have been used, when appropriate, to designate the same or similar elements that are common to the figures.

DETAILED DESCRIPTION OF THE INVENTION

Existing in-home coaxial networks often use signal dividers to split a television (TV) signal from an external service provider into a number of identical signals accessible by multiple items of consumer equipment connected to the in-home network. The signal dividers have a good return loss on their input and output ports and high isolation between their output ports. This ensures television signals transmitted to the in-home network do not suffer unduly from signal noise but two-way communication using the signal divider is very difficult and in many cases even impossible. Thus, other technologies, such as PowerLine, MoCA, and wireless, are difficult to use in combination with the existing coaxial network. The high isolation between the output ports of the signal divider provides a high signal path loss between the different outlets in the home.

Figure 1:
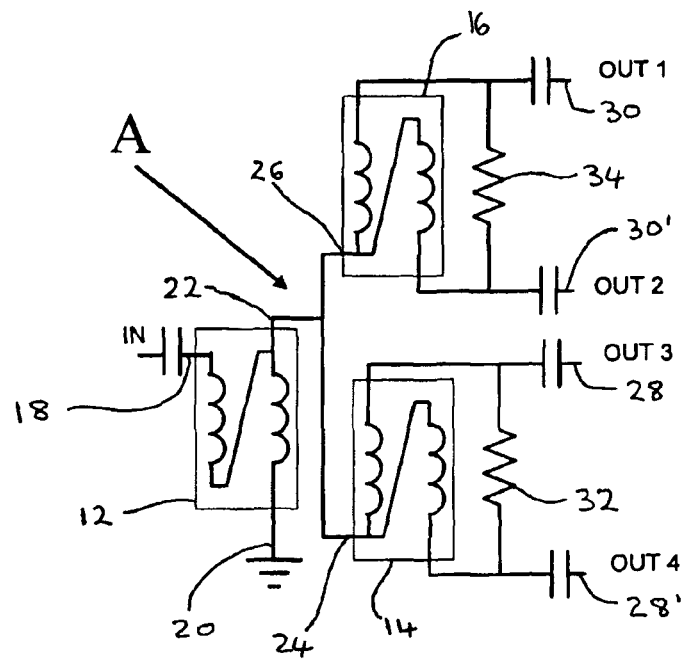
FIG. 1 is a schematic of a signal dividing device in accordance with the present invention.

FIG. 1 shows a signal dividing device in accordance with the present invention that allows two-way communication of TV, data and other signals through an in-home coaxial network.

The signal dividing device 10 comprises an impedance transformer 12, and two two-way splitters 14 and 16, each signal splitter having an input port and two output ports. The transformer 12 acts as a step-up transformer, with the primary and the secondary windings the same. Transformers within the splitters 14, 16 are 180 degree BALUN's or "forks". The input port 18 of the impedance transformer 12 is connectable, typically via a modem or other signal linking device, to an electrical communication path associated with a data signal provider/receiver such as a cable or satellite television/Internet service provider.

The impedance transformer 12 has One output or port 20 connected to earth, its second output 22 connected to the input ports 24, 26 of the first and second signal splitters 14, 16 such that the communication path between the first and second signal dividers and the input port is common. The first and second signal splitters 14, 16 each have two output ports 28, 28'; 30, 30' with a resistor 32 of 150 Ohm connected between the outputs of the second splitter 14, and similarly for the splitter 16, a resistor 34 of 150 Ohm. This will give a 75 Ohm impedance overall for the signal divider 10. The input signal received by port 18 is thus available to four output ports connectable to at least four items of consumer or subscriber equipment.

The impedance (as seen from the input 18) at point "A" in FIG. 1 is the design impedance of the signal divider divided by four. In case of a 75 Ohm signal divider this will be 18.75 Ohm. The transformer 12 of the signal divider 10 acts as a 4:1 impedance transformer so the characteristic impedance at the input will therefore be the same as the outputs. In the case of a 75 Ohm signal divider, this will be 75 Ohm. The input return loss of this configuration will be very good due to the impedance matching of the input and outputs.

The insertion loss of this signal divider from in-out will be 10 log [N] with N being the number of outputs and, with such a 4-way divider, the insertion loss will therefore be 6 dB.

The return loss at point 'A' with respect to 37.5 Ohm is 6 dB (with 18.75 Ohm in parallel with 37.5 Ohm). The isolation between output ports will therefore be: 6 dB return loss+2 times insertion loss of 3 dB (BALUN of splitter 14 or splitter 16)=12 dB.

The return loss at the outputs can be calculated from:

return loss at 'A' being 6dB+two times 3dB=12dB.

Thus such a signal divider can be used for two-way communication of TV signals, data and other signals as it has:
1. Low insertion loss from in-to-out with a value of 10 log [N] with N being the number of outputs
2. Good return loss at the input, typically >20 dB
3. Low isolation between output ports with a value of 20 log [N] with N being the number of outputs.
4. Reduced return loss at the output with a typical value of 12 dB. This defined level of return loss is needed since there might be a prior art signal divider mounted further down the network. With an output return loss of 12 dB it is ensured that the isolation of this prior art signal splitter will decrease to an acceptable value.

Figure 2:
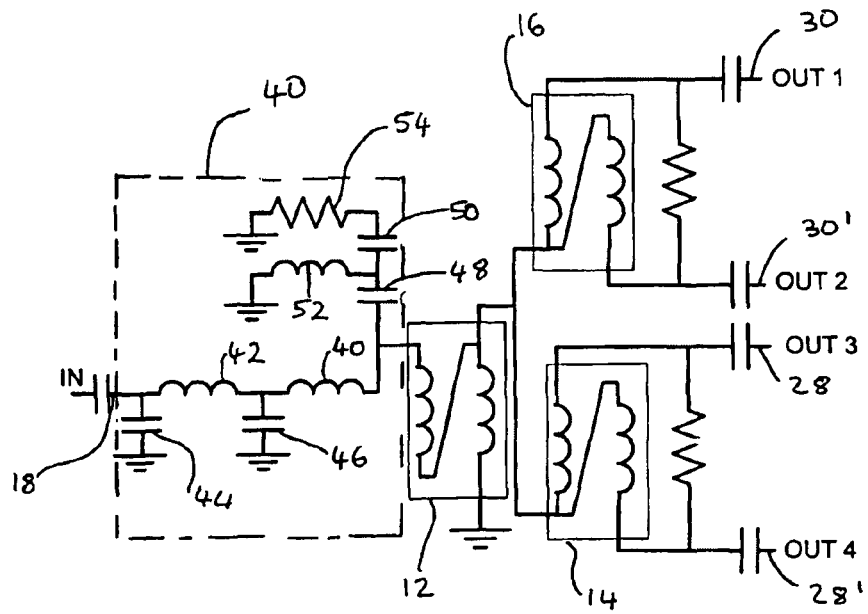
FIG. 2 is a schematic of such a device incorporating a diplex filter.

If the characteristic impedance of a signal linking device connected to the input 18 is not equal to the impedance of the signal divider 10 (typically 75 Ohm) over the full needed frequency range (typically 4 MHz to 2000 MHz), the isolation between the output ports will vary greatly depending on the chosen ports, the frequency and the actual return loss on the input. This occurs for many devices (like HPNA, Power-Line or more generally RF modems) where they have no or limited return loss outside their specific frequency range. By adding a terminated diplex filter 40 at the input 18 as shown in FIG. 2, the specified isolation between the outputs is restored.

Inductors 40 and 42 and capacitors 44, 46 form the low pass section of the diplexer 40. Capacitors 48 and 50 and inductor 52 form the high pass section. The value of resistor R3 is equal to the characteristic impedance of the signal divider 10, often 75 Ohm, as this resistor acts as a terminator for the high frequencies. When the signal divider 10 is used in an in-home coaxial network for two-way communication the frequency range of the low pass section could be 4 MHz to 60 MHz and the frequency range of the high pass section could be 200 MHz to 2000 MHz.

It can be seen that the diplexer 40 is not a reflective filter as the return loss on all ports over the frequency range is high (good matching) while a reflective filter has a return loss near 0 dB over one or all of the frequency range(s).

If required, depending on the application, resistor 54 could be removed and a separate high frequency input could be made at capacitor 50.

Depending on the application different configurations of diplex filters can be used. For example, in the case of MoCA as a transport technology with no CATV signals present on the in-home network, the diplexer could be omitted. When MoCA is used with CATV signals present, a different diplexer will be used to accommodate this. The use of diplexers is application dependent.

Inductors 40 and 42 and capacitors 44, 46 form the low pass section of the diplexer 40. Capacitors 48 and 50 and inductor 52 form the high pass section. The value of resistor 54 is equal to the characteristic impedance of the signal divider 10, often 75 Ohm, as this resistor acts as a terminator for the high frequencies. When the signal divider 10 is used in an in-home coaxial network for two-way communication the frequency range of the low pass section could be 4 MHz to 60 MHz and the frequency range of the high pass section could be 200 MHz to 2000 MHz.

The foregoing specific embodiments represent just some of the ways of practicing the present invention. Many other embodiments are possible within the spirit of the invention. Accordingly, the scope of the invention is not limited to the foregoing specification, but instead is given by the appended claims along with their full range of equivalents.

I claim:

1. A signal dividing device for use in a co-axial network used for distributing signals within a home, the signal dividing device comprising an auto-transformer having an input configured for connection to an electrical communication path associated with a data signal provider, a first and second two-way signal splitter, each of the two-way signal splitters having an input and first and second outputs, wherein the auto-transformer is a 4:1 auto-transformer and an output of the auto-transformer is connected to each input of the first and the second two-way signal splitters.

2. A signal dividing device according to claim 1, wherein a first resistive element is connected between the outputs of the first two-way signal splitter and a second resistive element is connected between the outputs of the second two-way signal splitter.

3. A signal dividing device according to claim 1, further comprising a diplex filter, or diplexer, connected at the input of the auto-transformer.

4. A signal dividing device according to claim 2, further comprising a diplex filter, or diplexer, connected at the input of the auto-transformer.

5. A coaxial network used for distributing television signals within the home, the network comprising at least one signal dividing device in accordance with claim 1.

* * * * *